(12) United States Patent
Chao et al.

(10) Patent No.: US 9,866,236 B1
(45) Date of Patent: *Jan. 9, 2018

(54) APPAPATUS AND METHOD FOR FAST CONVERSION, COMPACT, ULTRA LOW POWER, WIDE SUPPLY RANGE AUXILIARY DIGITAL TO ANALOG CONVERTERS

(71) Applicants: Yuan-Ju Chao, Cupertino, CA (US); Ta-Shun Chu, Hsunchu (TW)

(72) Inventors: Yuan-Ju Chao, Cupertino, CA (US); Ta-Shun Chu, Hsunchu (TW)

(73) Assignee: IPGreat Incorporated, Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 15/414,516

(22) Filed: Jan. 24, 2017

Related U.S. Application Data

(63) Continuation of application No. 15/247,651, filed on Aug. 25, 2016, now Pat. No. 9,621,180.

(51) Int. Cl.
*H03M 1/66* (2006.01)
*H03M 1/78* (2006.01)
*H03M 1/38* (2006.01)

(52) U.S. Cl.
CPC ............ *H03M 1/785* (2013.01); *H03M 1/38* (2013.01)

(58) Field of Classification Search
CPC ................................ H03M 1/785; H03M 1/38
USPC ......................................... 341/145, 150, 154
See application file for complete search history.

(56) References Cited

U.S. PATENT DOCUMENTS

| | | | | |
|---|---|---|---|---|
| 4,837,572 A | * | 6/1989 | Gulczynski | H03M 1/74 341/127 |
| 6,556,162 B2 | * | 4/2003 | Brownlow | G09G 3/3688 341/145 |
| 7,741,985 B2 | * | 6/2010 | Kubota | H03M 1/802 341/144 |
| 8,174,291 B1 | * | 5/2012 | Shah | H03K 5/1565 327/65 |
| 9,621,180 B1 | * | 4/2017 | Chao | H03M 1/785 |

* cited by examiner

*Primary Examiner* — Khai M Nguyen
(74) *Attorney, Agent, or Firm* — Tran & Associates

(57) ABSTRACT

A data converter includes a single-end capacitive digital to analog converter (DAC); a transconductance (GM) buffer having an output, a positive input coupled to the DAC and a negative input coupled to the output; a resistor and a capacitor load in parallel coupled to the output at one terminal and to ground at the other terminal. The developed architecture of comprising single end capacitive DAC and GM-based buffer provides fast conversion rate, low current consumption, small silicon area and wide supply range for general-purpose auxiliary DAC applications.

16 Claims, 9 Drawing Sheets

| | R-2R ladder DAC | Current steering DAC | Capacitive DAC |
|---|---|---|---|
| Consume static current | Yes | Yes | No |
| Conversion rate | Slow | Fast | Fast |
| Output range | Up to $V_{REF}$ | Limited | Up to $V_{REF}$ |
| Sources of mismatch | Resistor dimension | Transconductance and Threshold voltage | Capacitor dimension |
| Required layout area for 12bit accuracy | Large | Large | Small by using customized cap on FIG. 7B |

APPAPATUS AND METHOD FOR FAST CONVERSION, COMPACT, ULTRA LOW POWER, WIDE SUPPLY RANGE AUXILIARY DIGITAL TO ANALOG CONVERTERS

BACKGROUND

Auxiliary Digital to Analog Converter (DAC) is a very common functional block in the integrated circuit system. They are used in industrial control and automated test applications. They are needed for Automatic Gain Control (AGC) in communication transceivers ICs. For servo control system, a monotonic auxiliary DAC is crucial to close the servo loop. For data acquisition system, auxiliary DACs are widely used for the calibration or trimming of high-resolution data converters. For RF system, auxiliary DACs are employed to ensure I channel and Q channel gain matching and offset control. Auxiliary DACs are also an essential function in the high precision instrumentation system. The Micro-Controller Unit (MCU) and Field Programmable Gate Array (FPGA) all have the various auxiliary DAC feature for clients to exploit different functions. Auxiliary DACs are prevalent in nowadays integrated-circuit (IC) system.

As the systems get more complex and higher speed, auxiliary DACs with higher sampling rate and higher resolution are desired. The recent portable electronics are pushing for very low power auxiliary DAC. General purpose automated test equipment requires many channels of precisely controlled DAC outputs that span several voltage ranges. Large scale System-on-Chip (SoC) integrated circuit employs many channels of auxiliary DACs to control the surrounding utility IC such as power management IC (PMIC) to deliver a precise voltage supply with respect to the environment change like temperature. Thus the occupied silicon area is also a great concern if the auxiliary DAC area is not compact enough.

A new architecture of single-ended capacitive DAC with transconductance (GM)-based buffer is developed to achieve features of high resolution, high sampling rate, wide supply range, extremely low power, compact area and also being able to drive high capacitive/low resistive load for auxiliary DACs.

SUMMARY

One aspect uses single-end capacitive DAC followed by transconductance-based buffer architecture to achieve unique features of low power, compact area and wide supply range for high-resolution auxiliary DACs.

Another aspect includes an auxiliary Digital to Analog converter fabricated using a predetermined integrated circuit technology includes a capacitive DAC and single-pole transconductance-based buffer to drive a low resistive and high capacitive loading.

In another aspect, a data converter includes a single-end capacitive digital to analog converter (DAC); a transconductance (GM) buffer having an output, a positive input coupled to the DAC and a negative input coupled to the output; a resistor coupled to the output at one terminal and to ground at the other terminal; and a capacitor coupled to the output at one terminal and to ground at the other terminal. The developed architecture of comprising single end capacitive DAC and GM-based buffer provides high conversion rate, low current consumption, small silicon area and wide supply range for general-purpose auxiliary DAC applications.

Advantages of the converter may include one or more of the following. The present converter provides a minimal of current consumption and minimal of silicon area. Also the converter functions well with a very wide range of power supply. These features are very important specifications of converter for System-on-Chip (SoC) use.

A more complete appreciation of the present invention and its improvements can be obtained by reference to the accompanying drawings, which are briefly summarized below, to the following detailed description of illustrative embodiments of the invention, and to the appended claims.

DETAILED DESCRIPTION

Figure 1:
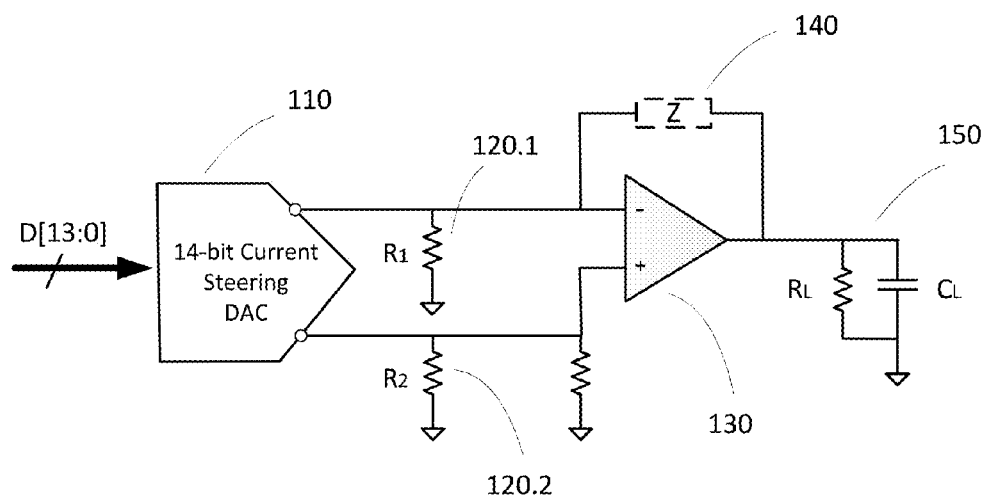
FIG. 1 illustrates architecture of auxiliary DAC.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes.

The terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Furthermore, it is to be noticed that the term "comprising", used in the claims, should not be interpreted as being restricted to the means listed thereafter; it does not exclude other elements or steps. Thus, the scope of the expression "a device comprising means A and B" should not be limited to devices consisting only of components A and B. It means that with respect to the present invention, the only relevant components of the device are A and B.

Similarly, it is to be noticed that the term "coupled" discloses both direct and indirect coupling and should not be interpreted as being restricted to direct connections only. Thus, the scope of the expression "a device A coupled to a device B" should not be limited to devices or systems wherein an output of device A is directly connected to an input of device B. It means that there exists a path between an output of A and an input of B which may be a path including other devices or means.

FIG. 1 illustrates an example of conventional architecture of auxiliary DAC. It consists of 14-bit current steering DAC 110 and followed by a voltage buffer 130. Resistor $R_1$ 120.1 and $R_2$ 120.2 convert the current steering DAC's current outputs to voltage outputs. The buffer 130 drives a load 150 which comprises of a resistor and a capacitor in parallel. Often the load is the components on the PCB (Printed Circuit Board) with the value of 10K ohms and 100p Farad range. Without the buffer, DAC itself is not able to drive such a low-resistive and high-capacitive loading.

Figure 2:
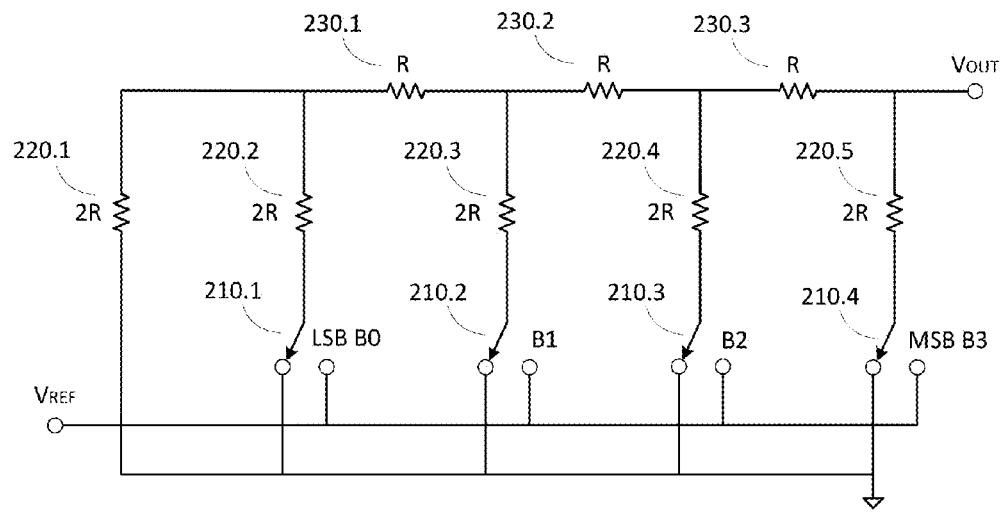
FIG. 2 shows R-2_R Ladder DAC architecture.

The two most common DAC architectures for auxiliary DACs are R-2R resistor ladder DACs and current steering DACs. FIG. 2 shows a 4-bit R-2R resistor ladder DAC diagram. It uses resistors of two different values with ratio of 2 to 1. An N-bit DAC requires 2N number of resistors. The switches controlled by 4-bit input code B3, B2, B1 and B0 can switch between $V_{REF}$ and ground. The output is taken from the end of the ladder. The output voltage $V_{OUT}$ can be derived as the following equation:

$$V_{OUT} = B3 * \frac{V_{REF}}{2} + B2 * \frac{V_{REF}}{4} + B1 * \frac{V_{REF}}{8} + B0 * \frac{V_{REF}}{16}$$

The drawback of using R-2R architecture as auxiliary DAC function is that R-2R structure draws static current $V_{REF}/R$ from $V_{REF}$. Increasing R will reduce the static current but slow down the conversion rate due to the RC time constant is increased. Another drawback of R-2R resistor ladder DAC is that the resistor dimension needs to be very large in order to obtain a good matching characteristic between resistors. The DAC linearity degrades if there is mismatch between resistors. Besides, the non-zero resistance of switches 210.1, 210.2, 210.3, 210.4 is identified as one issue during the circuit implementation of R-2R resistor ladder DACs. The total resistance for each vertical branch is actually the sum of the passive resistor value 2R and the switch resistance. If the exact 2 to 1 ratio between the vertical 2R resistors 210.1, 210.2, 210.3 and the horizontal resistors 230.1, 230.2, 230.3 is not maintained due to extra resistance from switches, the R-2R ladder DAC linearity degrades. Furthermore, the switch resistance is output voltage $V_{OUT}$ dependent. This dependency results in signal distortion.

Figure 3:
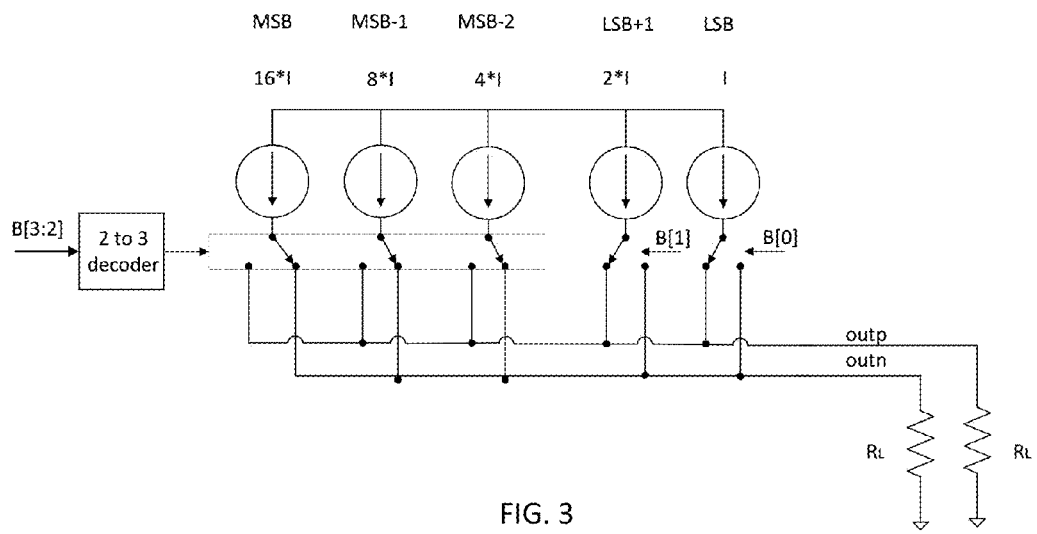
FIG. 3 shows current steering DAC architecture.
Figure 4A:
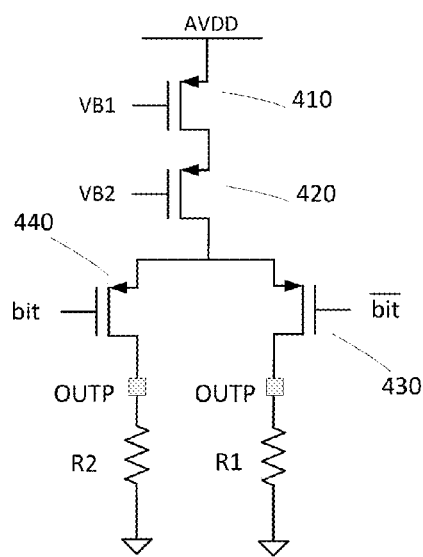
FIG. 4A shows the PMOS current source implementation of the current steering DAC.
Figure 4B:
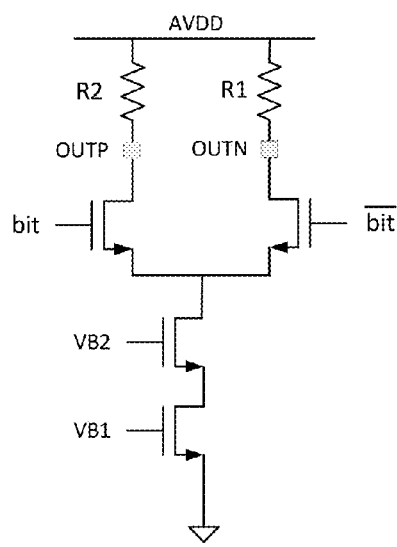
FIG. 4B shows the NMOS current source implementation of the current steering DAC.

Another common current steering DAC architecture for auxiliary DACs is illustrated on FIG. 3. Current steering DACs are based on an array of matched current sources that are switched to output according to digital input code. The current sources can be binary weighted structure, thermometer based structure or segmented structure which is a combination of binary and thermometer structure. Shown on FIG. 3 is a 4 bit segmented DAC with upper 2 bits as thermometer structure and lower 2 bits as binary structure. The advantage of current steering DACs is the fast conversion rate. However current steering DACs suffer two limitations when they are used in auxiliary function applications. First drawback is that current steering DACs consume relative large static current since they are composed by an array of current sources. Secondly, the outputs of current steering DACs have a limitation on the output voltage range. Shown on FIG. 4A and FIG. 4B are current steering DACs using PMOS current source and NMOS current source respectively. The current will flow onto load $R_2$ or $R_1$ depending on the switch that is controlled by the input bit. OUTP and OUTN are the differential outputs of the current steering DAC. The maximum OUTP voltage is described as:

$$OUTP_{max} = AVDD - Vds_{,410} - Vds_{,420} - Vds_{,430}$$

$Vds_{,410}$, $Vds_{,420}$ and $Vds_{,430}$ are the drain to source voltage of the PMOS transistors required to maintain on their saturation operation region. If OUTP is higher than $OUTP_{max}$, the PMOS device will move away their functional operation region and the current source characteristic changes, which results in the degradation the DAC performance. Similar for NMOS current source, OUTP/OUTN have a minimum voltage required to maintain the three stacked NMOS devices in their saturation operation region.

Figures 5, 6:
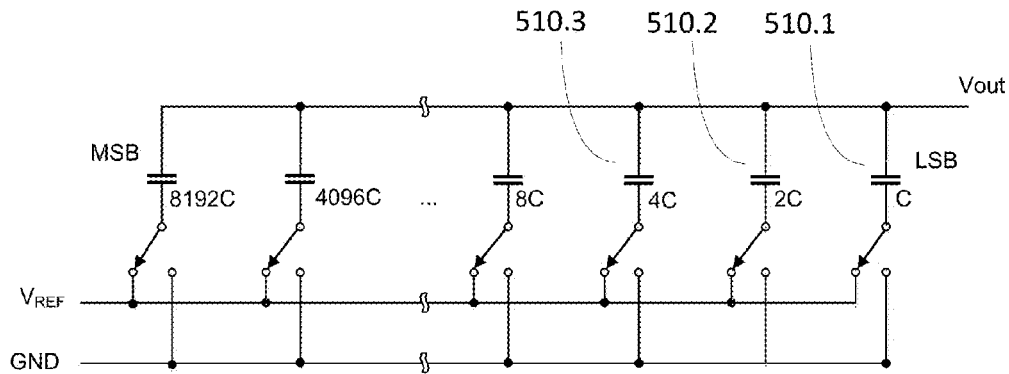
FIG. 5 shows the capacitive DAC architecture.
FIG. 6 is a table of comparison for different DAC architectures.

In additional to R-2R resistor ladder DACs and current steering DACs discussed above, another type of DAC is capacitive DACs. Capacitive DACs are primarily used to serve the DAC function for SARADC (Successive Approximation Register Analog to Digital Converters) since all ADCs necessitate internal DACs to represent different levels of references. Capacitive DAC is an array of capacitors that employs the principle of charge redistribution to generate an analog output voltage. The capacitors can be binary structure, thermometer structure or segmented structure. FIG. 5 is the diagram of 14-bit binary capacitive DAC architecture. It consists of 14 binary capacitors. The cap can connect to $V_{REF}$ or ground. The DAC output voltage can be derived as the following equation:

$$V_{OUT} = B13 * \frac{V_{REF}}{2} + B12 * \frac{V_{REF}}{4} + \ldots B1 * \frac{V_{REF}}{2^{13}} + B0 * \frac{V_{REF}}{2^{14}}$$

Capacitive DACs consume no static current and also features fast conversion rate.

FIG. 6 is a table that summarizes the advantages and disadvantages of the three discussed DAC architectures. Among these three DAC architectures, current steering DAC is best suited for high conversion rate application and R-2R resistor ladder architecture is best suited for low conversion rate application. For ultra low power less than 10MSPS conversion rate application, capacitive DAC is best suited since capacitive DACs require zero static current and perform fast conversion.

Figure 7A:
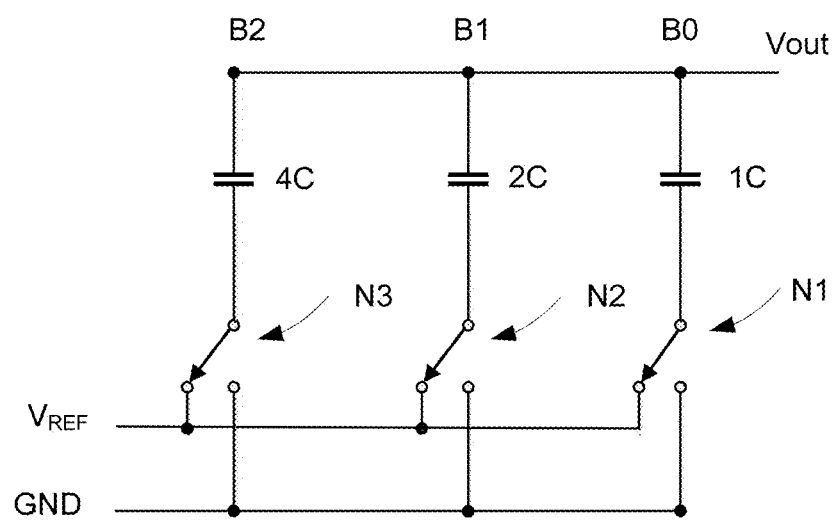
FIG. 7A shows the three least significant bits of capacitive DAC.
Figure 7B:
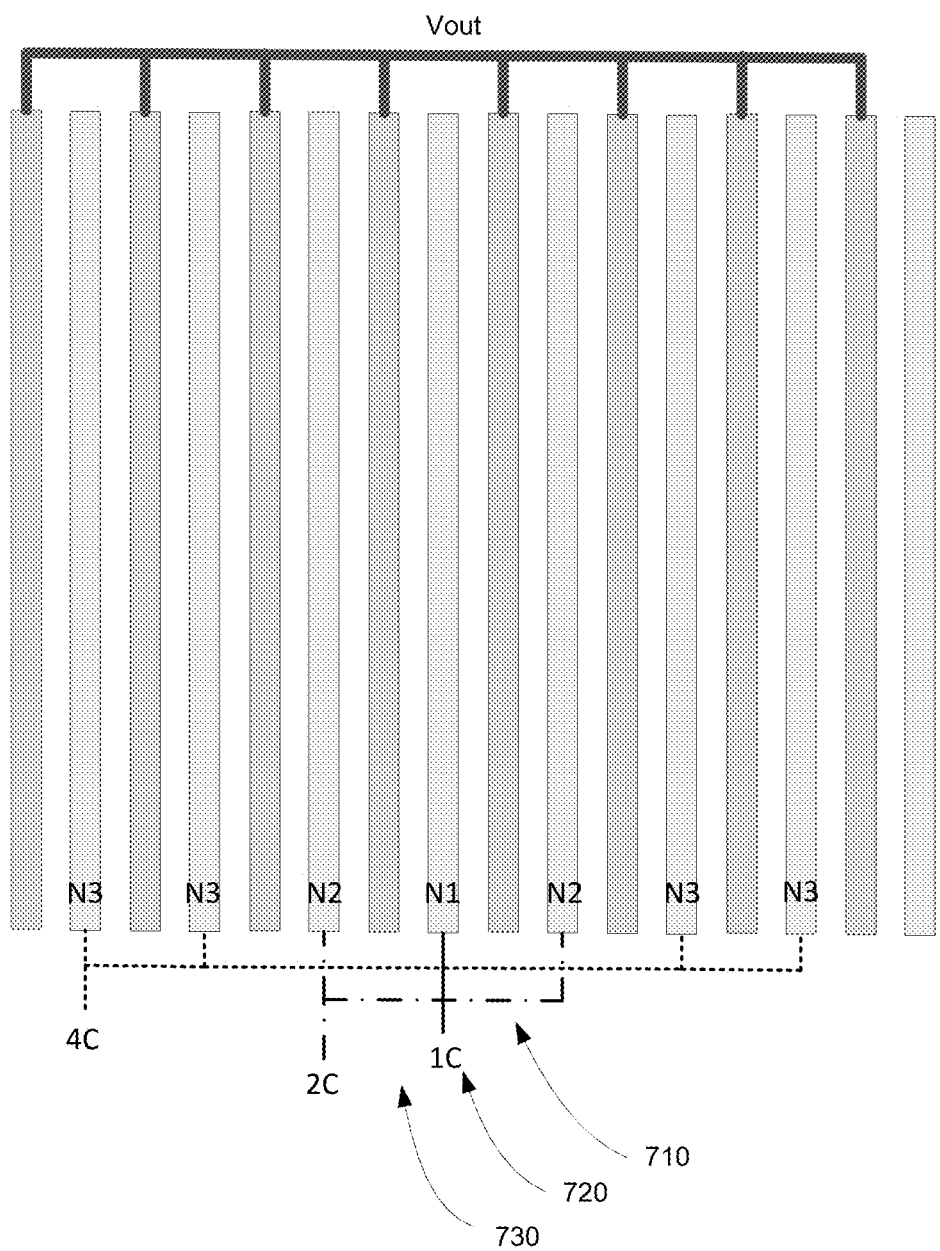
FIG. 7B illustrates the customized capacitor implementation for capacitive DAC.

The non-linearity of capacitive DACs primarily arises from the mismatch of capacitors. FIG. 7B illustrates a method of the capacitors physical implementation that achieves high density, superior matching and small area. The three least significant bits capacitors 510.1, 510.2 and 510.3 on FIG. 5, is redrawn on FIG. 7A. The three capacitors values are 1C, 2C and 4C respectively. Each capacitor has two terminals. One terminal is connected to the switch (N1, N2 and N3) and the other terminals of the capacitors are all connected together to node $V_{out}$. FIG. 7B shows the layout implementation of these three capacitors. The lateral-field capacitors are formed by an array of metal lines in parallel. These metal lines are placed uniformly with equal spacing and distance to obtain desired matching properties. The capacitance value is determined by the spacing between metal lines and can be adjusted according to the specified capacitance as long as the spacing meets the technology design rule. Each metal line with two adjacent metal lines represents 1C capacitance. B0's 1C capacitance is formed by three metal lines elements 710, 720 and 730. B1's capacitance 2C employs six metal lines and is formed by connecting two 1C capacitors. Similarly, B2's capacitance 4C is formed by connecting four 1C capacitors together. The other terminals of capacitors are all connected to node $V_{out}$. FIG. 7B only shows one layer of metal line, more metal lines can be stacked up for achieving higher capacitance value. The symmetry and uniformity of these metal lines result in superior matching among the array of capacitance and minimize the non-linearity of capacitive DACs. For advanced deep submicron integrated circuit process, capacitive DACs gain more benefits owing to the higher capacitance density and better matching characteristics.

One essential requirement of the general-purpose auxiliary DAC is the ability to drive off-chip load. The external RC loading is usually at 10K ohms and 100P Farad range. As shown on FIG. 1, $R_1$ and $R_2$ 120.1 and 120.2 convert the current steering DAC's output current to voltage then buffer 130 takes the DAC differential outputs and drives load $R_L$ and $C_L$ 150. The buffer 130 is in a closed loop configuration with component Z 140 in the feedback loop. Feedback component Z can be resistor, capacitor or resistor and capacitor in parallel to provide extra gain and filtering features. The buffer 130 also employs differential to single end conversion since the auxiliary DAC output is mostly configured as single-ended output.

Figure 8:
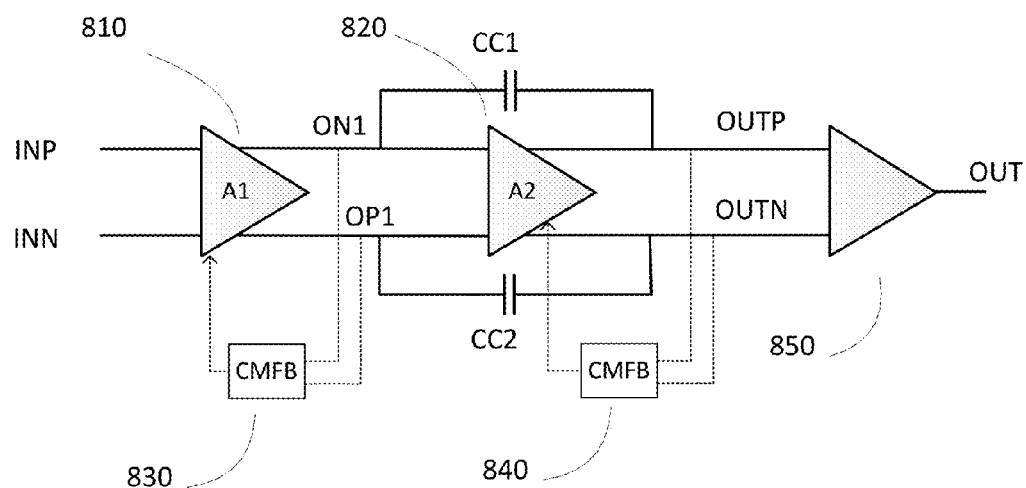
FIG. 8 shows a buffer architecture for auxiliary DAC.

FIG. 8 illustrates the conventional two-stage buffer structure. The first stage A1 810 is a high gain amplifier and the second stage A2 820 is a class AB amplifier in order to drive low resistive load. For fully differential architecture, each stage requires common mode feedback (CMFB) 830, 840 circuitry to ensure the common mode voltage is controlled at its specified value. The last stage 850 is a differential to single end conversion stage which takes differential voltages OUTP/OUTN and produces OUT as buffer output. Since there are two gain stages, compensation components CC1, CC2 are required to establish stability. The open-loop gain of amplifier A1 810 is important to obtain adequate linearity. For 12-bit linearity requirement, the open-loop DC gain needs to be at least 4000 (V/V) or 72 dB. Such a high DC gain mandates a very high impedance at the first amplifier A1's outputs OP1/ON1. This high impedance necessitates that the dominated pole of the buffer has to be placed at A1's outputs OP1/ON1 while the second non-dominated pole is placed at the second amplifier A2's outputs OUTP/OUTN. Since stability criteria requires the two poles location need to be at least one decade apart from each other for good phase margin. This pole arrangement results in severe reduction of overall buffer bandwidth. Consider the loading of 100K ohms and 100P Farad, the pole location is 160 HKz purely determined by the RC time constant. The dominated pole frequency has to be pushed further to a lower frequency. This low bandwidth amplifier significantly limits the conversion rate of the overall auxiliary DAC.

Figure 9:
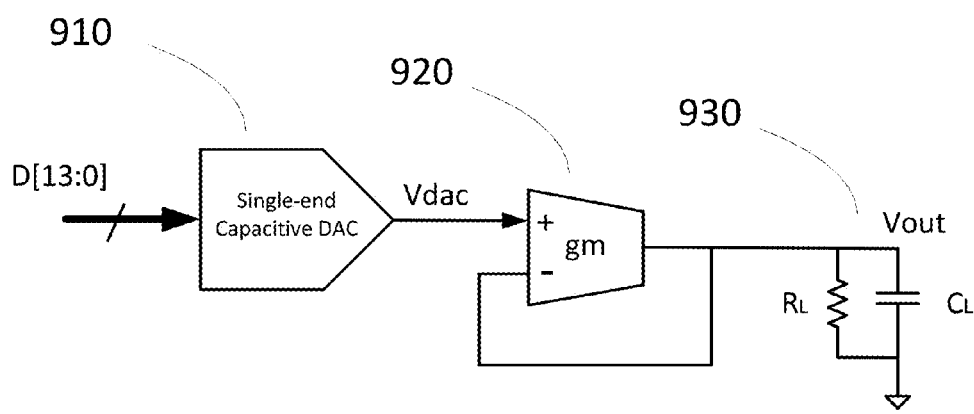
FIG. 9 presents an exemplary auxiliary DAC architecture.

FIG. 9 presents a developed auxiliary DAC architecture optimized to achieve features of low power, compact area, high conversion rate and wide supply range. It comprises a single-ended capacitive DAC 910 followed by a transconductance (GM) based buffer 920 to drive external load 930. Since auxiliary DAC output configuration is single ended, utilizing a single-ended capacitive DAC produces the direct signal path and avoids the circuit overhead of differential to single end conversion. The capacitive DAC structure has been illustrated on FIG. 5, the cap array can be binary structure, thermometer structure or segmented structure depending on the linearity requirement. The physical implementation of 3 bit capacitance array has been shown on FIG. 7B to obtain symmetry and uniformity among the capacitance array for superior matching. The circuit diagrams of GM-based buffer using NMOS input pair is illustrated on FIG. 10A. Device 101 and 102 form the differential input pair. Bias current $IB_1$, $IB_2$ and device 103 and 104 establish the DC bias operating point. Device 105 and 106 form a current mirror with current ratio of N to M. Input node INP directly connects to single end capacitive DAC output and another input node INN is coupled to buffer output $V_{out}$ on upper level to form a negative feedback loop as illustrated on FIG. 9. Similarly for PMOS input pair on FIG. 10B, device 201 and 202 form the differential input pair. The DC bias operating point is established using bias current $IB_3$, $IB_4$ and device 203 and 204. Device 205 and 206 form a current mirror with current ratio of N to M. Input node INP connects to capacitive DAC output and another input node INN is coupled to buffer output $V_{out}$ on upper level to form a negative feedback loop.

Figure 10A:
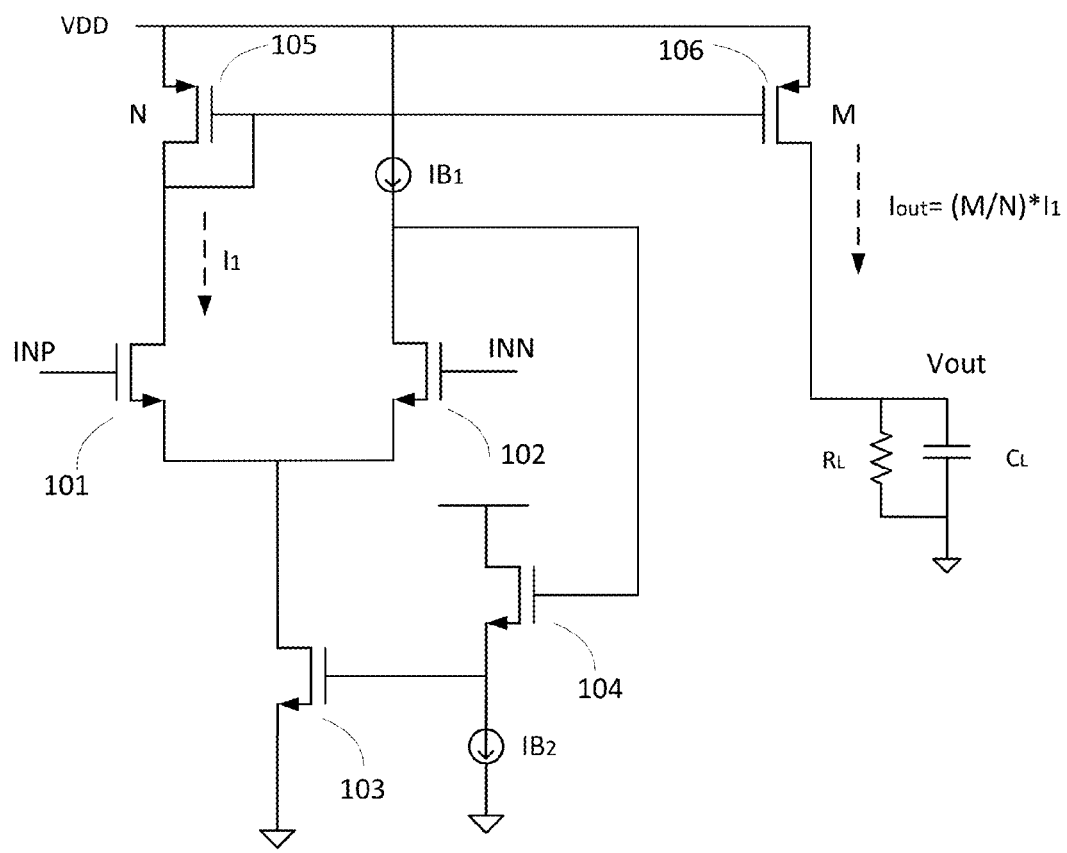
FIG. 10A presents an exemplary diagram of NMOS input pair GM-based buffer.
Figure 10B:
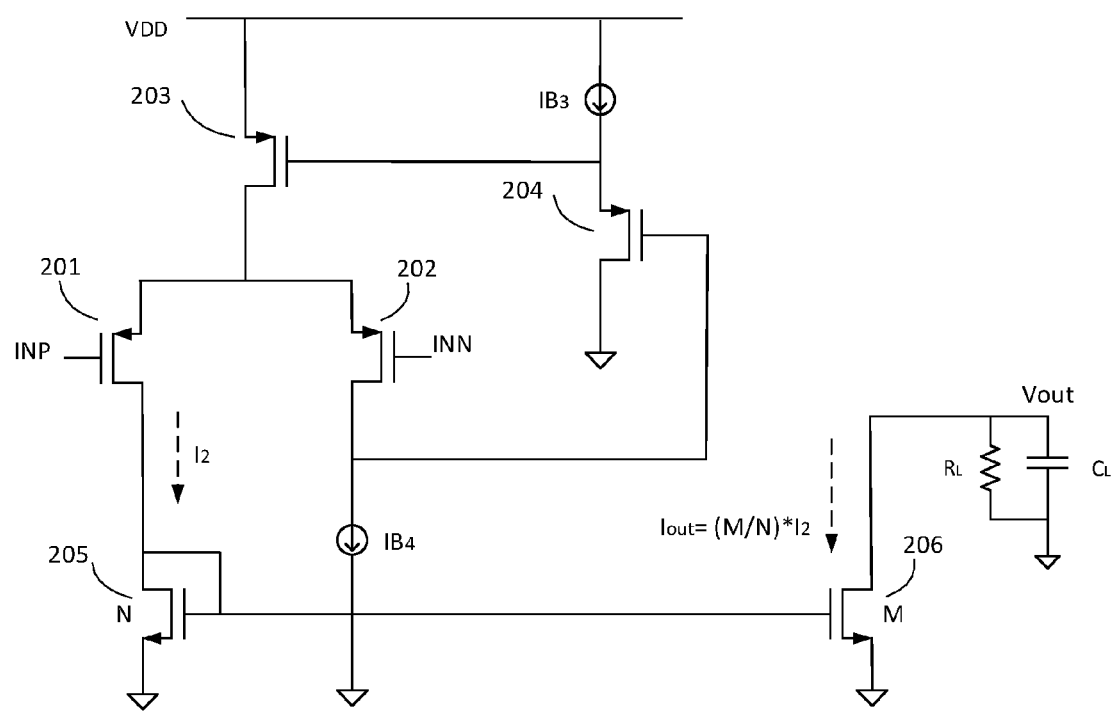
FIG. 10B presents an exemplary diagram of PMOS input pair GM based buffer.

As illustrated on FIG. 9 and FIG. 10A, a larger input code D[13:0] produces a higher output voltage on the capacitive DAC output Vdac. This increase on voltage introduces an extra current $I_1$ flowing into device 101. The current mirror pair 105 and 106 injects current Iout=(M/N)*I1 into load $R_L$ and $C_L$. With the injected current, the output voltage $V_{out}$ is increased. The buffer 920 output $V_{out}$ is connected back to buffer negative input node to form a unit-gain buffer configuration. The close loop configuration forces the buffer output $V_{out}$ follows and tracks capacitive DAC output Vdac.

Figure 11:
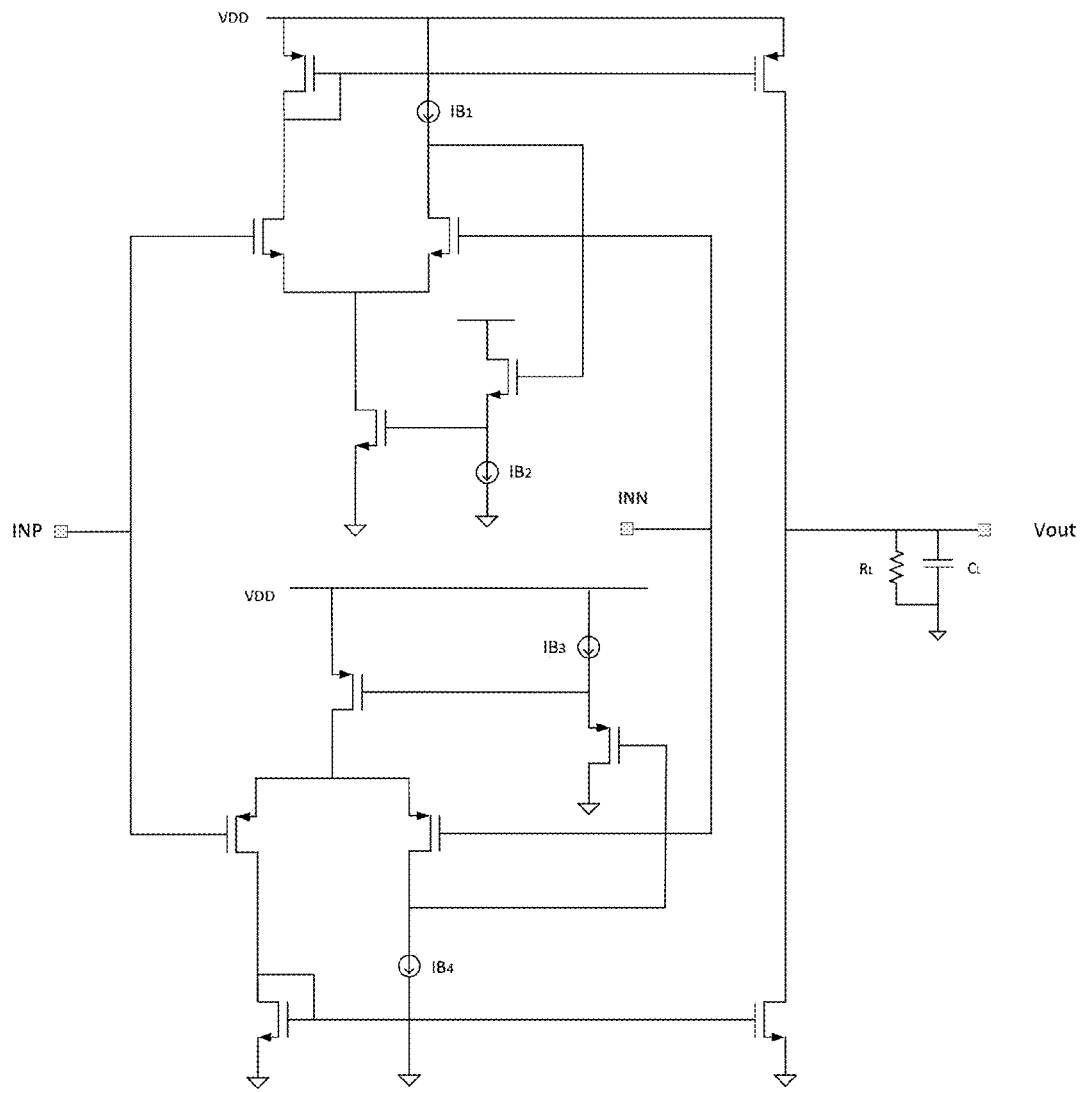
FIG. 11 presents an exemplary diagram of rail-to-rail input GM based buffer.

The GM-based buffer introduces no high impedance node in the signal path from input to output. The buffer output node with high capacitance serves as the dominated pole. This arrangement results in a single pole system that guarantees the loop stability. The buffer bandwidth is determined by the input pair transconductance (GM) and load capacitance $C_L$ and can be represented as GM/$C_L$. The buffer bandwidth can be very high without limiting the overall auxiliary DAC conversation rate. For rail-to-rail input range requirement, FIG. 10A and FIG. 10B can be combined to one buffer which employs both PMOS input pair and NMOS input pair to cover the whole input range from GND to supply. The rail-to-rail buffer structure is illustrated on FIG. 11.

The developed GM-based buffer converts the differential input voltages into current and mirror out the current directly to the output node. The close-loop configuration mandates the buffer output track and follow the buffer input to obtain desired linearity. It only employs one stage and there is no need for stability compensation. The majority of current is utilized to drive the load except the bias current which can be very minimal. The GM-based buffer significantly reduces the current and power consumption since it avoids the compensation, common-mode feedback (CMFB) circuit and differential to single-end conversion.

The developed architecture of single-ended capacitive DAC coupled with GM-based buffer produces an optimal solution for general-purpose auxiliary DAC applications. This structure provides fast conversion and achieves a very low power current consumption with a very compact silicon area. It accomplishes rail-to-rail operation for both the input and output.

While various embodiments of the present invention have been described above, it should be understood that they have been presented by way of example, and not limitation. It will be apparent to persons skilled in the relevant art that various changes in form and detail can be made therein without departing from the spirit and scope of the invention.

The breadth and scope of the present invention should not be limited by any of the above-described exemplary embodiments, but should be defined only in accordance with the following claims and their equivalents.

What is claimed is:

1. A data converter, comprising:
   a single-end capacitive digital to analog converter (DAC);
   a transconductance (GM) buffer having an output, a positive input coupled to the DAC and a negative input coupled to the output and an input range from ground to supply;
   a resistor and a capacitor in parallel coupled to the output at one terminal and to ground at the other terminal.

2. The data converter of claim 1, wherein the GM buffer comprises an NMOS input pair, a PMOS input pair or both NMOS and PMOS pairs.

3. The data converter of claim 1, wherein the GM buffer comprises a PMOS input pair, further comprising a differential input nodes INP and INN, a direct current bias current generator, and a current mirror pair with a predetermined current ratio.

4. The data converter of claim 1, wherein when the capacitive DAC output increases from an input code, node INP voltage is increased and injects an extra current in a current mirror pair into the resistive and capacitive loads and increases an output voltage to follow an input voltage at node INP.

5. The data converter of claim 1, wherein the GM buffer has no high-impedance node.

6. The data converter of claim 1, wherein the buffer has PMOS input pair and NMOS input pair to cover an input range from ground to supply.

7. A method for performing digital to analog conversion, comprising:
   providing a single-end capacitive digital to analog converter (DAC);
   buffering the output of the capacitive DAC with a transconductance (GM) buffer;
   using the GM buffer to cover an input range from ground to supply; and
   driving a load comprising a resistor coupled to the output at one terminal and to ground at the other terminal and a capacitor coupled to the output at one terminal and to ground at the other terminal.

8. The method of claim 7, wherein the GM buffer comprises an NMOS input pair, a PMOS input pair or both NMOS and PMOS input pairs.

9. The method of claim 7, wherein the GM buffer comprises a PMOS input pair, further comprising a differential input nodes INP and INN, a direct current bias current generator, and a current mirror pair with a predetermined current ratio.

10. The method of claim 7, wherein when the capacitive DAC output increases from an input code, node INP voltage is increased and injects an extra current in a current mirror pair into the resistive and capacitive loads and increases an output voltage to follow an input voltage at node INP.

11. The method of claim 7, wherein the GM buffer has no high-impedance node.

12. The method of claim 7, comprising providing both PMOS input pair and NMOS input pair in the buffer to cover an input range from ground to supply.

13. A data converter, comprising:
   a single-end capacitive digital to analog converter (DAC);
   a transconductance (GM) buffer having an output, a positive input coupled to the DAC and a negative input coupled to the output; and
   a resistor and a capacitor in parallel coupled to the output at one terminal and to ground at the other terminal, and a differential input nodes, a direct current bias current generator, and a current mirror pair with a predetermined current ratio.

14. The data converter of claim 13, wherein the GM buffer comprises an NMOS input pair, a PMOS input pair or both NMOS and PMOS pairs.

15. The data converter of claim 13, wherein the GM buffer comprises a PMOS input pair, further comprising a differential input nodes INP and INN, a direct current bias current generator, and a current mirror pair with a predetermined current ratio.

16. The data converter of claim 13, wherein when the capacitive DAC output increases from an input code, node INP voltage is increased and injects an extra current in a current mirror pair into the resistive and capacitive loads and increases an output voltage to follow an input voltage at node INP.

* * * * *